United States Patent [19]

Yoshida

[11] Patent Number: 5,059,825
[45] Date of Patent: Oct. 22, 1991

[54] NAND GATE CIRCUIT

[75] Inventor: Masanobu Yoshida, Yokohama, Japan

[73] Assignee: Fujitsu Limited, Kawasaki, Japan

[21] Appl. No.: 424,038

[22] Filed: Oct. 19, 1989

[30] Foreign Application Priority Data

Oct. 27, 1988 [JP] Japan ................................ 63-269408

[51] Int. Cl.[5] ................. H03K 19/017; H03K 19/094; H03K 19/20; H03K 17/687
[52] U.S. Cl. .................................... 307/448; 307/449; 307/443; 307/452; 307/453
[58] Field of Search .............. 307/443, 451, 452, 453, 307/448, 585, 449, 464; 365/226

[56] References Cited

U.S. PATENT DOCUMENTS

| 4,620,116 | 10/1986 | Ozawa | 307/449 |
| 4,649,296 | 3/1987 | Shoji | 307/443 X |
| 4,730,133 | 3/1988 | Yoshida | 307/452 X |
| 4,780,626 | 10/1988 | Guerin et al. | 307/453 X |
| 4,797,580 | 1/1989 | Sunter | 307/443 X |
| 4,827,160 | 5/1989 | Okano | 307/449 X |
| 4,851,716 | 7/1989 | Needles et al. | 307/443 X |

OTHER PUBLICATIONS

Patent abstracts of Japan, vol. 6, No. 144 (E-122)[1022], Aug. 3, 1982 & JP-Aj-57 67 333 (Matsushita Denki Sangyo K.K.), Apr. 23, 1982.
Patent abstracts of Japan, vol. 2, No. 51, Apr. 12, 1978, p. 965 E 78, & JP-A-53 15 055 (Tokyo Shibaura Denki K. K.), 02-10-1978.
IEEE Journal of Solid-State Circuits, vol. SC-19, No. 5, Oct. 1984, pp. 657–663, IEEE, New York, U.S., S. Tanaka et al., "A Subnanosecond 8K-Gate CMOS/-SOS Gate Array".

Primary Examiner—Stanley D. Miller
Assistant Examiner—David R. Bertelson
Attorney, Agent, or Firm—Armstrong, Nikaido, Marmelstein, Kubovcik & Murray

[57] ABSTRACT

A NAND gate circuit which can be used for a decoder circuit, includes a high potential voltage source ($V_{cc}$), an output terminal ($V_{OUT}$), and a load element ($T_1$) connected between the high potential electric voltage source ($V_{cc}$) and the output terminal ($V_{OUT}$). A driving circuit is serially connected with the output terminal ($V_{OUT}$), and a low potential voltage source ($V_{ss}$), and has a plurality of driving transistors ($T_2$, $T_3$) which are serially arranged. An input signal is applied to each gate. At least one transistor, constituting the driving circuit, has a driving performance different from the other transistors of the driving circuit. An ideal NAND gate circuit can be provided in which erroneous operation due to noise can be effectively prevented by setting the input threshold voltage to a constant voltage no matter what the combination of the input signals.

11 Claims, 8 Drawing Sheets

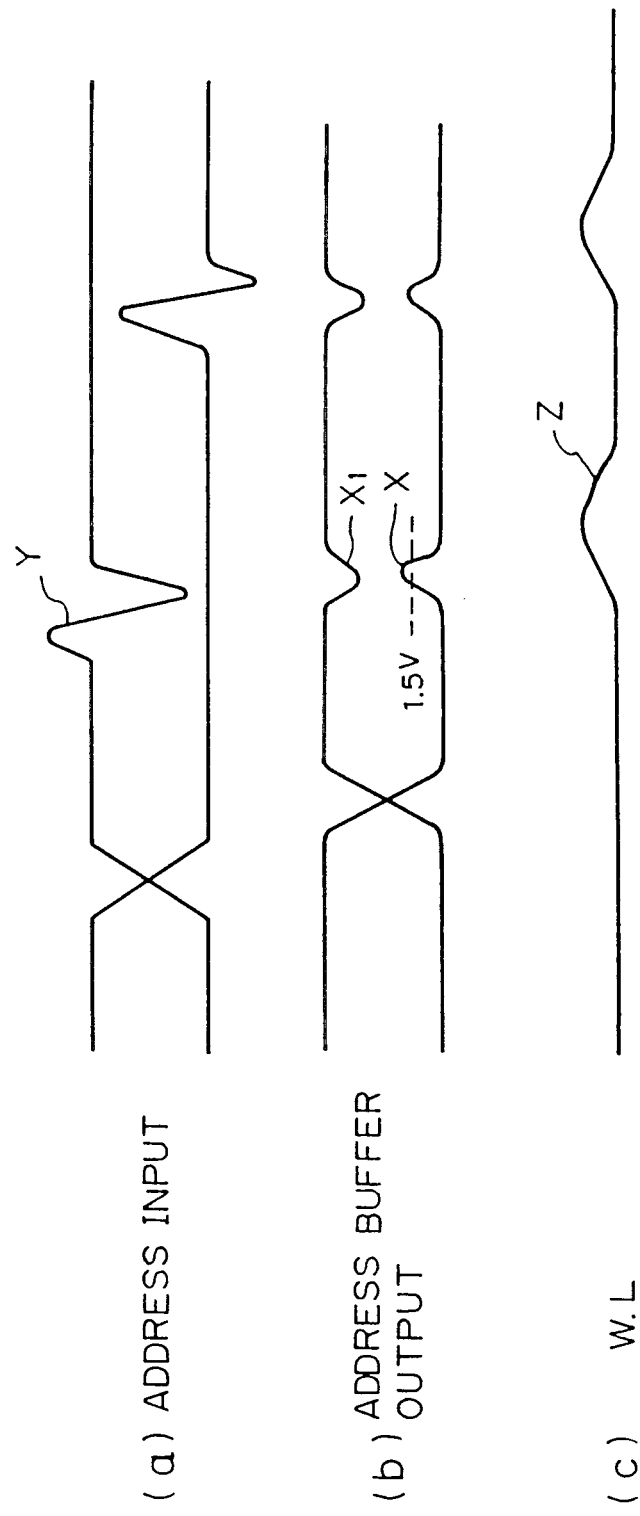

Fig. 8 (A)
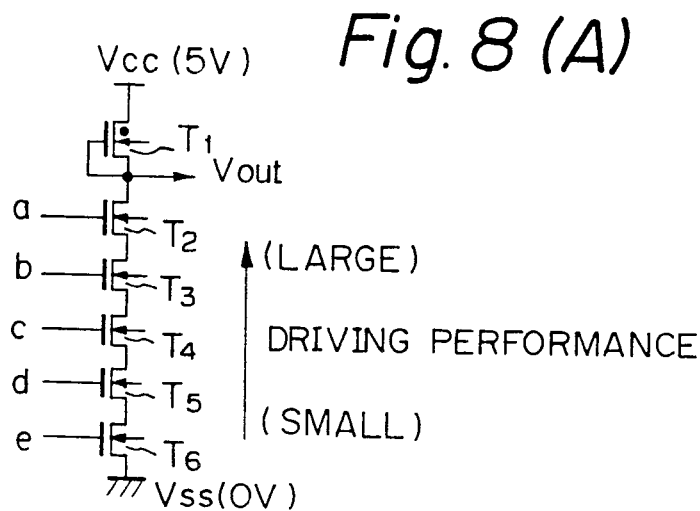
Fig. 8 (B) (PRIOR ART)
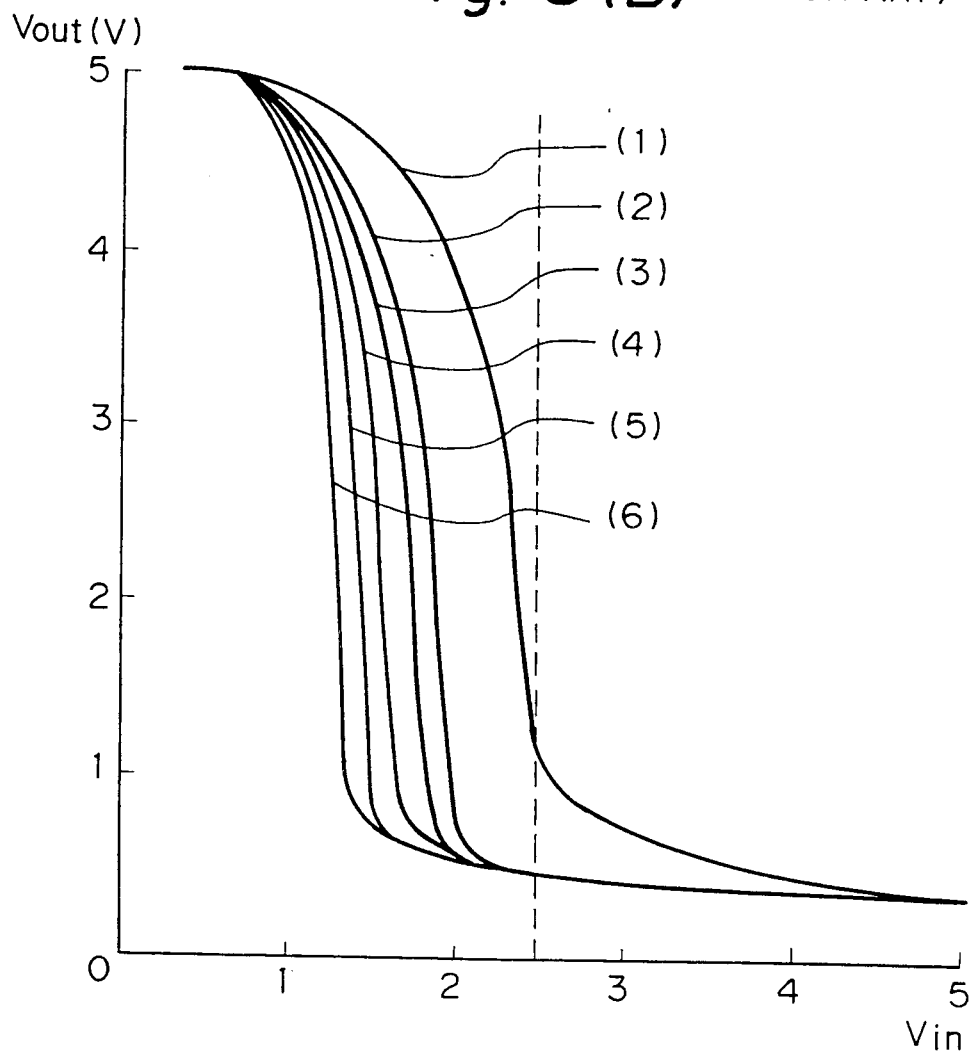

NAND GATE CIRCUIT

BACKGROUND OF THE INVENTION

1. Field of the Invention

The present invention relates to a NAND gate circuit used for a decoder circuit provided in a semiconductor memory device.

2. Description of the Related Art

FIG. 1(A) shows an ordinary conventional decoder circuit and in FIG. 1 $V_{cc}$ is a source voltage, for example 5 V, while $V_{ss}$ is a ground potential (0 V).

A transistor $T_1$ used for a load means, for example, an N channel depletion type MOS transistor, and driving transistors $T_2$ and $T_3$, for example, N channel enhancement type MOS transistors used as a driving circuit, are provided.

In this NAND gate circuit, both an input a to the transistor $T_2$ and an input b to the transistor $T_3$ are binary signals and the transistors $T_2$ and $T_3$ are of the same type.

In the circuit, when fixing the voltage of the input a at 5 V, if the voltage of input b, for example, is increased from 0 V to 5 V or decreased from 5 V to 0 V, the output voltage $V_{OUT}$ which appears midway, changes from the voltage of nearly 5 V to nearly 0 V or from nearly 0 V to nearly 5 V.

Therefore, previously when the voltage exceeds 2 V, the level of the voltage should be discriminated as "H", and when lower than 2 V, it should be discriminated as "L", the output level of the NAND gate circuit fluctuates from "H" to "L" when the voltage of the input b is varied from 0 V to 5 V.

The same is true when the voltage of the input a is varied in the same way as above.

Note that, the input voltage at which the level of the output voltage of the NAND gate circuit changes from "H" to "L" or vice versa is called as the input threshold voltage of the NAND gate circuit.

In a NAND gate circuit, however, the input threshold voltage changes depending upon the formation of the input voltage applied to the input a and b.

Namely, the input threshold voltage of the NAND gate circuit differs as shown in FIG. 1(B), in three ways depending on whether the input voltage b was changed while the input voltage a was fixed at 5 V (only the input voltage b was changed) as shown by a curve (2) in FIG. 1(B), the input voltage a was changed while the input voltage b was fixed at 5 V (only the input voltage a was changed) as shown by a curve (1) in FIG. 1(B), or both the input voltages a and b were simultaneously changed (both the input voltages a and b are changed) as shown by a curve (3) in FIG. 1(B).

Note that, for example, the input threshold voltage of the NAND gate circuit obtained when only the input voltage b is changed and the input voltage a is fixed at 5 V is 1.5 V, the input threshold voltage obtained when the input voltage a is changed and the input voltage b is fixed at 5 V is 2.0 V, and the input threshold voltage obtained when both the input voltages a and b are simultaneously changed is 2.5 V.

The reasons why this happens in such a conventional NAND gate circuit are as follows;

First, when the input voltage b is changed while the input voltage a is fixed at 5 V, the source voltage of the transistor $T_3$ is $V_{ss}$, i.e., 0 V When the input voltage a is changed while the input voltage b is fixed at 5 V, the drain voltage of the transistor $T_3$ will be increased beyond 0 V due to the transistor $T_3$ being ON, enabling current to flow therein.

The source voltage of the transistor $T_2$ is increased beyond $V_{ss}$, i.e., 0 V since the drain voltage of the transistor $T_3$ corresponds to the a source voltage of the transistor $T_2$.

Therefore, there is a "back gate effect" in which a threshold voltage $V_{th}$ of a transistor will be increased when the a source voltage thereof becomes higher than the substrate voltage.

Also, the gate-source voltage of the transistor $T_2$ is reduced at that time. Therefore, the output of the NAND gate circuit cannot be reversed unless a relatively high voltage is applied to the input a of the transistor $T_2$.

This means that, in this situation, the load of this circuit cannot be driven when the gate voltage of the transistor $T_2$ is relatively high.

Second, the threshold voltage of the NAND gate circuit will be substantially increased since the total current driving performance of each transistor $T_2$ and $T_3$ is weakened compared with the performance obtained in the situation in which one of the input voltages a and b is fixed at 5 V.

As explained above, when the threshold voltage of the NAND gate circuit changes according to the combination of the input voltages, applied to the input terminals of the circuit, a problem arises in that the noise immunity, i.e., the immunity to noise for each signal input to a certain transistor will become different from the others and the total noise immunity will deteriorate accordingly.

This situation will be explained more specifically with respect to FIG. 1(B).

The transistors used in the NAND gate circuit is presented, as follows;

The transistors $T_2$ and $T_3$ have a threshold voltage $V_{th}$ of 0.6 V, a thickness of the gate oxide film of 350 Å, a gate width of 50 μm, and a gate length of 2 μm, while the transistor $T_1$ has a threshold voltage $V_{th}$ of −3.5 V, a thickness of the a gate oxide film of 350Å, a gate width of 20 μm, and a gate length of 5 μm.

As apparent from FIG. 1(B), when the NAND gate circuit is operated at voltage $V_{cc}$ of 5 V, the input threshold voltage is 2.15 V, 1.95 V and 2.45 V obtained when the input voltage a alone is changed, the input voltage b alone is changed and both the input voltages a and b are simultaneously changed, respectively.

The curves (1), (2), and (3) show the an outputs of the NAND gate circuit according to the three formations of input voltages.

When the input threshold voltage of the NAND gate circuit changes with respect to the inputs to the circuit, the immunity to noise of the input voltages will become different, and thus the overall noise immunity of the circuit will detoriorate.

For example, as apparent from the curve (3), if the input voltages a and b are equally $V_{cc}=5$ V, the NAND gate circuit outputs a voltage having a level of "H" instead of "L" when noise is added to any one of the input signals to reduce the input signal voltage level below 2.55 V.

While, if the input voltage a is set at $V_{cc}=5$ V and the input voltage b is set at $V_{ss}=0$ V, the NAND gate circuit outputs a voltage having a level of "L" instead of "H" when noise is added to the input signals to increase the input signal voltage level over 1.95 V.

This means that the noise immunity for the input voltage of the NAND gate circuit is 2.55 V for voltage descending from $V_{cc}$ and 1.95 V for voltage increasing from $V_{ss}$.

Thus a poor noise immunity is obtained and a problem arises of deterioration of the overall noise immunity.

The more the driving transistors arranged serially in the driving circuit in the NAND gate circuit, the more remarkably the noise immunity is deteriorated.

There is thus a significant problem in a decoder circuit including an NAND gate circuit when there are more than five transistors serially arranged.

Namely, the conventional NAND gate circuit is weak against noises.

Note that, when a NAND gate circuit is deteriorated in noise immunity, it will frequently operate erroneously with respect to the signals input to the gates of the driving transistors of the driving circuit. Also, a NAND gate circuit is generally used for a main circuit of a decoder connected to a memory cell array in a memory device.

Therefore, when the NAND gate circuit erroneously operates due to noise added to the signals, input to the gates of the driving transistors, the erroneous information generated from the NAND gate circuit, i.e., decoder, significantly affects the memory cell array or the like in the memory device, causing erroneous information to be output from the memory device.

How the erroneous operation in a NAND gate circuit, i.e., decoder, affects a semiconductor memory device will be explained with reference to FIGS. 2 to 5.

Typical decoder consisting of NAND gate circuit has a circuit construction as shown in FIG. 2, as known from Japanese Unexamined Patent Publication (Kokai) No. 61-45496.

Referring first to FIG. 2, showing the circuit construction and operation of the prior art, in a decoder circuit consisting of NAND gate circuit, a source voltage $V_{PPI}$ can be internally switched to two different voltage levels such as a low voltage of about 5 V (referred to as $V_{cc}$ hereinafter) in a reading mode and a high voltage of about 12.5 V (referred to as $V_{PP}$ hereinafter) in a writing mode.

The decoder includes a decoder circuit and a CMOS inverter (IV).

In the decoder circuit, i.e., a NAND gate circuit, an N-channel depletion type MOS transistor $T_1$ and N-channel enhancement type MOS transistors $T_2$ to $T_5$ are provided.

In the inverter, an N-channel enhancement type MOS transistor $T_7$ and a P channel enhancement type MOS transistor $T_6$ are provided.

As apparent from FIG. 2, the NAND gate circuit consists of the transistor $T_1$ as a load means and the transistors $T_2$ to $T_5$ as a driving circuit.

The output $N_1$ which drives the CMOS inverter (IV) consists of the transistors $T_6$ and $T_7$.

An output of the CMOS inverter (IV) connects to a word line (WL).

A memory cell transistor MC is provided at each cross point of the word line (WL) and bit lines $BL_0$, $BL_1$, $BL_2$ ....

Input address signals a to d are applied to the gates of the driving transistors $T_2$ to $T_5$, respectively.

In a stable condition, these input address signals selectively show either the $V_{cc}$ level (logic "1") or $V_{ss}$ level (logic "0", usually showing the ground level, i.e., 0 V).

When all the voltage levels of the input address signals a to d are $V_{cc}$, the node $N_1$ (output of 0 the decoder circuit) is reduced nearly to $V_{ss}$, i.e., 0 V, regardless of whether the decoder source voltage $V_{PPI}$ is $V_{cc}$ or $V_{pp}$.

Thus, the node $N_2$, i.e., the output voltage of the inverter is increased to $V_{PPI}$.

If one or more of the input address signals a to d is $V_{ss}$, the output $N_1$ of the decoder circuit (DEC) is increased to $V_{PPI}$.

Thus, the output of the inverter $N_2$ is reduced to $V_{ss}$, i.e., 0 V.

Here, the input address signals a to d are given from, for example, the outputs of an address buffer circuit in which the address signals applied externally thereto are subjected to a waveform shaping operation inside the chip.

In a conventional semiconductor memory device, when the decoder once erroneously operates, erroneous information is transferred to a memory cell array and finally incorrect information is output from the memory device.

Generally speaking, as shown in FIG. 3, address signal inputs externally provided are applied to the input terminal of a buffer circuit with a waveform as shown in FIG. 3(a), are subjected to a waveform shaping operation, and are output to the input terminals of the decoder circuit with a waveform as shown in FIG. 3(b).

In this situation, suppose that when a noise Y is added to the address signal as shown in FIG. 3(a), the output signal of the address buffer inherently has the abnormal signal portion X and X' in response to the noise portion Y as shown in FIG. 3(b).

Then, when the output signal of the address buffer including such an abnormal signal portion X is input to the decoder circuit, the decoder will erroneously operate depending upon the level of the abnormal signal portion and the level of the threshold set for the decoder circuit.

If the level of the abnormal signal portion is higher or lower than the threshold level set for the decoder circuit, the decoder circuit will erroneously operate and output a erroneous signal information Z to the word line WL as shown in FIG. 3(c).

More specifically, when the decoder circuit is set to that, as shown in FIG. 4, outputs of the address buffer having the "H" level are applied to the gates a, b, and c of the transistors $T_2$ to $T_4$, the output thereof of the "L" level is applied to the gate d of the driving transistor $T_5$ of the driving circuit of the decoder circuit, the input threshold voltage is set at 1.5 V.

Accordingly, in this situation, the output $V_{OUT}$ at the node $N_1$ of the decoder circuit is at the "H" level and thus the output at the node $N_2$ of the inverter is at the "L" level, as shown in FIG. 4, Now, suppose that when an abnormal signal portion X having a level exceeding 1.5 V is instantly applied to the input terminal d, the level of the output $V_{OUT}$ of the decoder circuit is instantly switched to the "L" level instead of being the "H" level naturally, whereby the level of the output of the inverter is also instantly switched to the "H" level instead of being the "L" level naturally.

Therefore, in this situation, the word line WL connected to this decoder is a non-selected word line and thereby the signal level thereof inherently is "L", although the level of the word line will be increased from the level of 0 V to form an abnormal signal portion z as shown in FIG. 3(c) so as to mistakenly read or write information from or into a certain memory cell.

While, when the duration of such an abnormal signal portion is remarkably short, such a signal does not affect the circuits arranged downstream of the circuit concerned so much, although, when the duration is relatively long, the effect is considerable.

In a memory cell array used in a semiconductor memory device, a plurality of pairs of resistors and capacitors are serially arranged therein.

An equivalent circuit thereof can be drawn as shown in FIG. 5.

Therefore, a signal output from an inventor including an abnormal signal level will be delayed and the duration of the abnormal signal portion will be prolonged due to the existence of the plurality of time constants created by CR.

When such a prolonged signal portion p is output to the sense amplifier, the sense amplifier will necessarily read erroneous date p with a threshold level $V_L$ for a period t as shown in FIG. 9.

To avoid such erroneous operation of the decoder circuit and thus also the semiconductor memory device due to such deterioration of the overall noise immunity, it has been proposed to construct an address buffer circuit which will not respond to noise so sharply, but it is very difficult to completely prevent such problems by such a method.

SUMMARY OF THE INVENTION

As explained above, in a conventional NAND gate circuit, even if the NAND gate circuit is composed of a plurality of transistors as a driving circuit, all of which have the same current driving performance, i.e., all of the transistors have the same characteristics and the same power, the input threshold voltage of the NAND gate circuit differs depending upon the input-condition of the input signals and thus the overall noise immunity is deteriorated and erroneous operation of the NAND gate circuit frequently occurs.

The object of the present invention is to eliminated the drawback of the conventional NAND gate circuit used in a decoder circuit and to provide a NAND gate circuit which seldom operates erroneously due to noise, by setting the input threshold voltage at a constant voltage for all combinations of signals input thereto.

Another object is to provide a semiconductor memory device which can operate accurately both in the writing mode and the reading mode even when noise is added to the input signals by utilizing a decoder circuit consisting of an NAND gate circuit having an improved noise resistance.

To attain these objects, there is provided a NAND gate circuit which comprises a high potential voltage source ($V_{cc}$) line, an output terminal ($V_{OUT}$), a low potential voltage source ($V_{ss}$) line, a load element ($T_1$) connected between the high potential voltage source ($V_{cc}$) line and the output terminal ($V_{OUT}$), and a driving circuit, connected between said output terminal ($V_{OUT}$) and the low potential voltage source ($V_{ss}$) line, including a plurality of driving transistors ($T_2$, $T_3$) connected in series, the driving transistors being controlled by an input signal being applied to each gate, at least one of the driving transistors having a driving performance different from that of the other driving transistors constituting the driving circuit.

BRIEF DESCRIPTION OF THE DRAWINGS

FIGS. 3(A), 3(B) and 3(C) are waveforms of an address signal input to an address buffer, an output signal from the address buffer, and a voltage level of a word line in a conventional semiconductor memory device, respectively;

FIG. 8(A) shows another embodiment of the NAND gate circuit of the present invention;

FIG. 8(B) is a graph showing the input-output curve of an input threshold voltage of the NAND gate circuit shown in FIG. 8(A);

DESCRIPTION OF THE PREFERRED EMBODIMENTS

Preferred embodiments of the present invention will be explained in detail hereunder with reference to the attached drawings.

Figure 6:
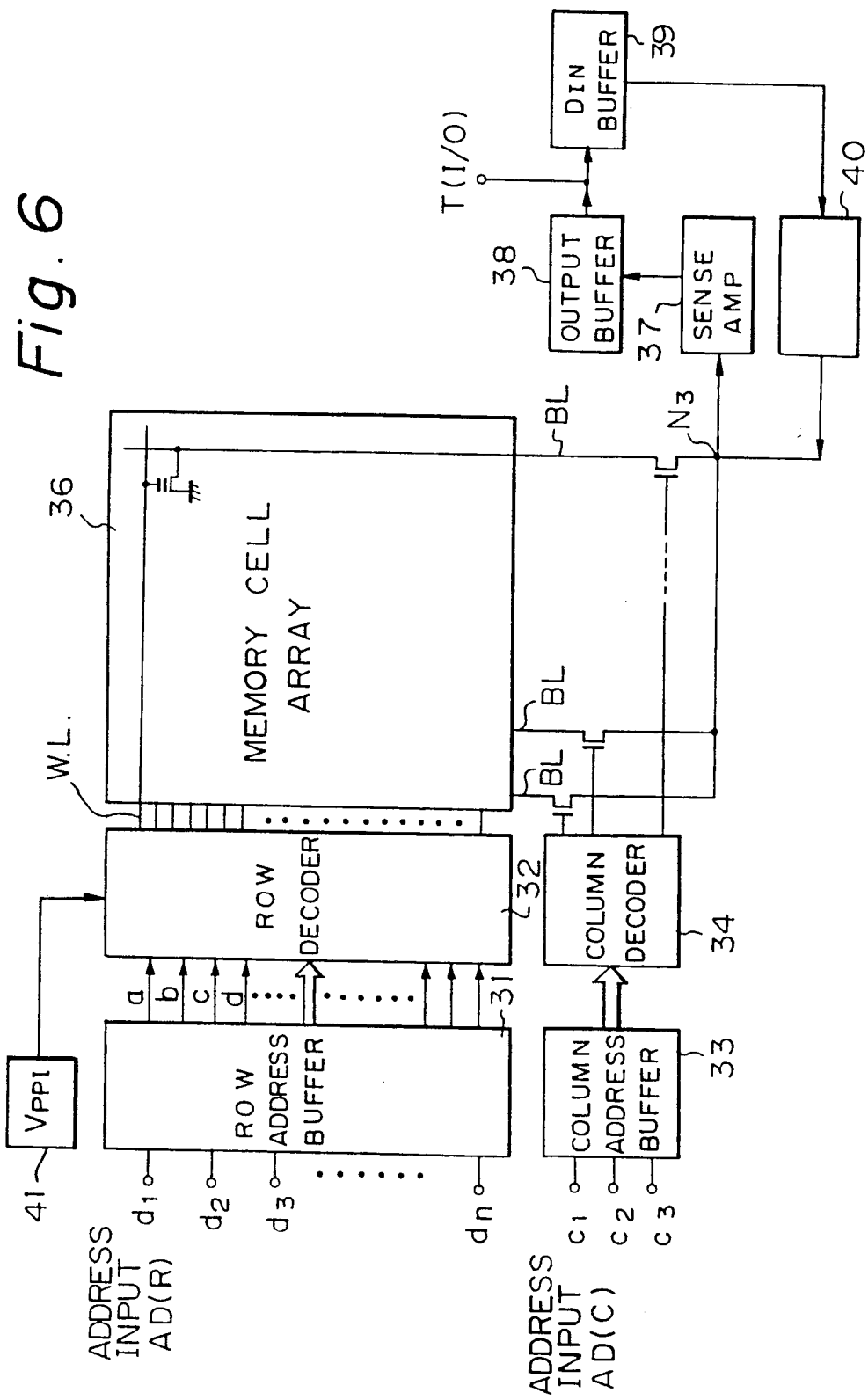
FIG. 6 is a block diagram of an embodiment of a semiconductor memory device in which a NAND gate circuit of the present invention is used as a main part of a decoder circuit.

The overall construction of an embodiment of a semiconductor memory device of the present invention including a NAND gate circuit used as a decoder circuit is shown in FIG. 6.

The semiconductor memory device includes a row address buffer 31, a row decoder 32, a memory cell array 36, a column address buffer 33, a column decoder 34, and a switching circuit 41 for setting the decoder voltage at $V_{PP}$ in the writing mode and at $V_{cc}$ in the reading mode.

To an output terminal $N_3$ of the memory cell array 36, a sense amplifier 37, an output buffer 38, a date-in buffer ($D_{IN}$ buffer) 39, and a writing circuit 40 are connected.

In this device, the address signals for word lines of the memory cell array are input to the terminal $d_1$, $d_2$ ... $d_n$ of the row address buffer 31 to perform the waveform shaping.

The outputs therefrom are applied to the input terminals a, b, c and d of the row decoder 32, for example.

Figure 2:
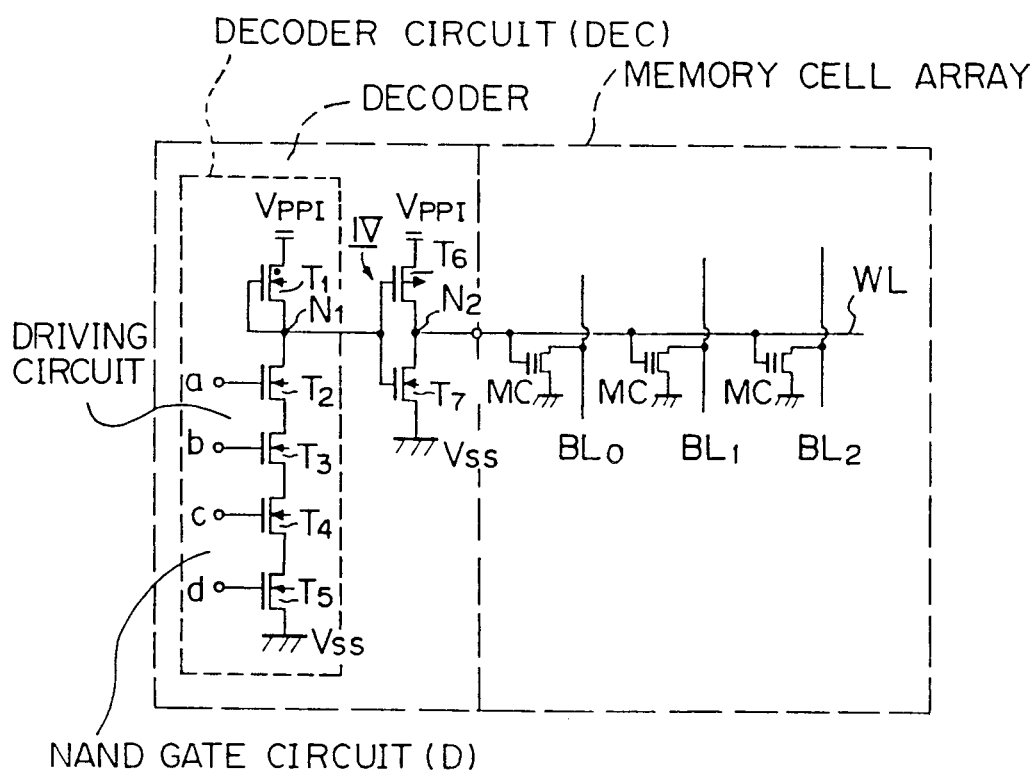
FIG. 2 is a diagram of an example of a conventional semiconductor memory device with a decoder circuit composed of NAND gate circuit.
Figure 9:
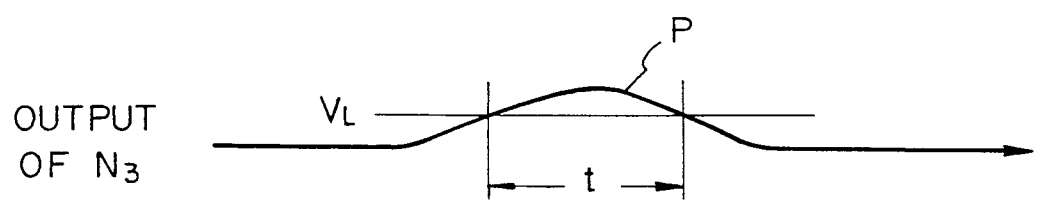
FIG. 9 is chart illustrating the condition when a sense amplifier reads erroneous date on a signal taken out from a memory cell.
Figure 4:
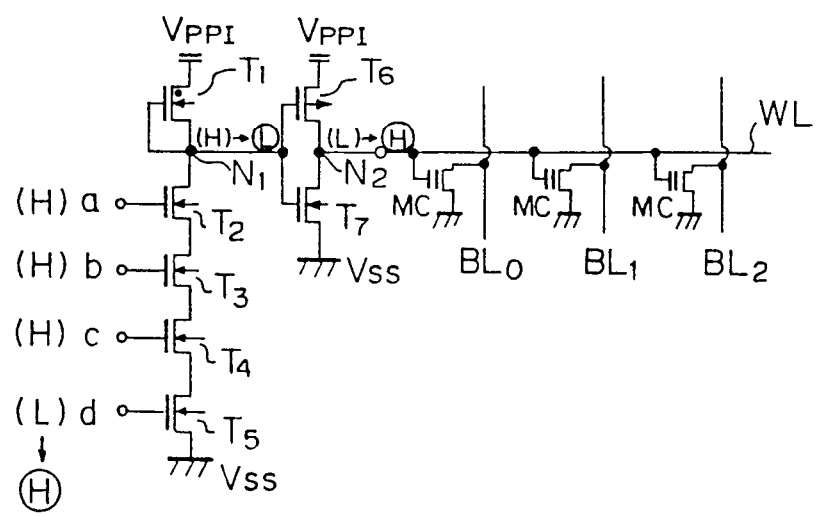
FIG. 4 is a block diagram of a decoder of a conventional semiconductor memory device showing one situation thereof as an example.
Figure 5:
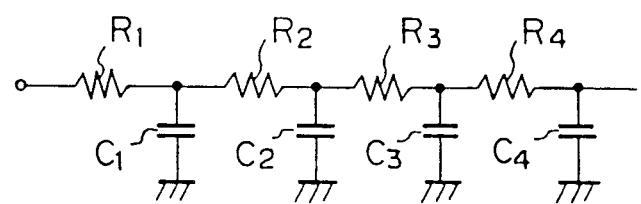
FIG. 5 is an equivalent circuit of one of the word lines in a memory cell array.

In FIG. 6., the NAND gate circuit for the decoder circuit comprises a plurality of the transistors, for example, one transistor for a load transistor and four transistors as driving transistors used as a driving circuit, as shown in FIG. 2.

Figure 7A:
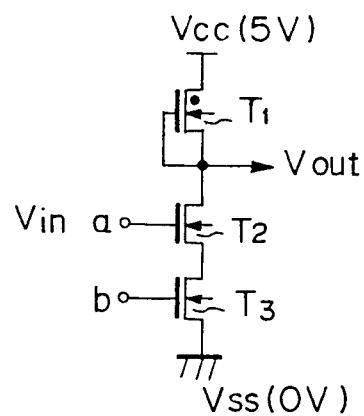
FIG. 7(A) shows one example of the NAND gate circuit of the present invention.

It is also, however, possible to use two and five transistors as shown in FIGS. 7(A) and 8(A).

The input terminals a to d of the row decoder in FIG. 6 correspond to the input terminals a to d of the driving transistors $T_2$ to $T_5$ provided in the NAND gate circuit as shown in FIGS. 2.

The row decoder 32 includes a load means $T_1$.

A decoder circuit including the NAND gate circuit includes a plurality of serially arranged driving transistors $T_2$ to $T_5$ as a driving circuit, and an inverter circuit IV.

As explained above, the driving transistors consisting the NAND gate circuit are characterized in that at least one has a driving performance different from the others.

The output of the decoder circuit 32 is applied to the word lines WL to select one.

The word lines WL are part of a memory cell array 36 in which a plurality of memory cells MC are provided at cross points between the word lines WL and the bit lines BL as shown in FIG. 2.

In this embodiment, the semiconductor device may be an EPROM, EEPROM, or the like.

The address signals for the bit lines BL of the memory cell array are input to the terminals $c_1, c_2 \ldots c_n$ of the column address buffer 33.

The outputs are applied to the column decoder 34 in the same manner as explained above.

The output of the decoder circuit 34 is applied to the bit lines $BL_1, BL_2, \ldots BL_n$ to select a certain bit line through a transistor.

In the present invention, the semiconductor memory device is provided with a voltage switching circuit 41 to switch the decoder source voltage from a high level $V_{PP}$ to a low level $V_{cc}$ or vice versa in accordance with the reading mode or the writing mode.

The resultant voltage is applied to the decoder source voltage terminal $V_{PPI}$ as shown in FIG. 2 in the row decoder 32.

In the reading mode, the signal voltage output from the input and output terminal $N_3$ of the memory cell array 36 is applied to the sense amplifier 37 to read them.

The output from the data input-output terminal T(I/O) goes through an output buffer circuit 38.

In the writing mode, the data to be written is input to the data-in buffer circuit 39 through the data input-output terminal T(I/O).

The output from the data-in buffer circuit 39 is input to the input-output terminal $N_3$ of the memory cell array 36 through the writing circuit 40.

In the present invention, the load element $T_1$ may be constructed by a transistor or a resistor.

The NAND gate circuit of the present invention comprises a plurality of driving transistors, each of which has a sufficiently large current driving characteristic compared with the load element for driving.

The number of driving transistors used in the NAND gate circuit may be more than two and can be determined as desired in accordance with the object of the circuit used. For example, when it is used as a decoder, five or six transistors are popularly used.

Figure 1A:
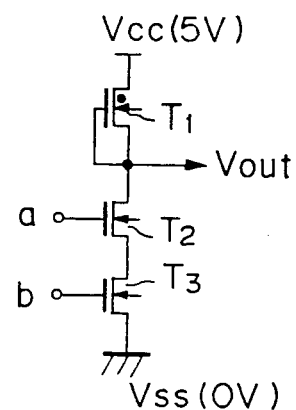
FIG. 1(A) shows a conventional NAND gate circuit.
Figure 1B:
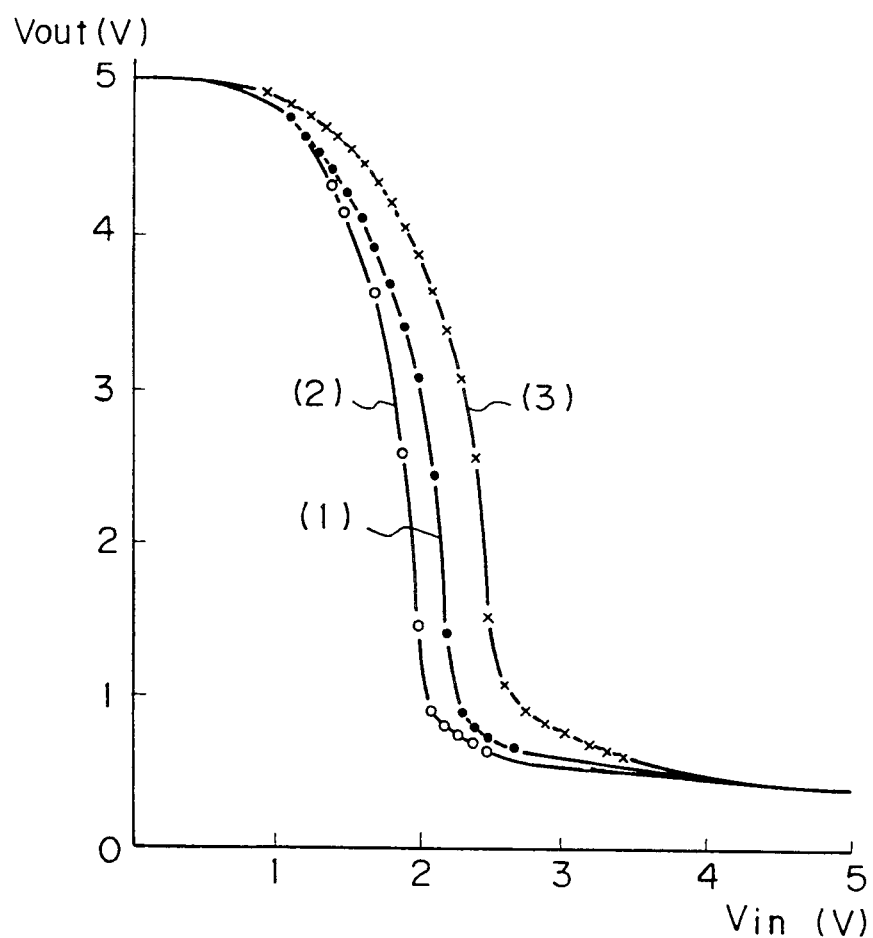
FIG. 1(B) is a graph showing the input-output curve of an input threshold voltage of the conventional NAND gate circuit.

Generally, regarding the NAND gate circuit, in order to prevent erroneous operation due to a variation of the input signals, it is preferable that the reversing point of a waveform level of the input voltage as shown in FIG. 1(B) be fixed at a somewhat constant point, for example, at $V_{cc}/2$.

The characteristic feature of the present invention is that the NAND gate circuit has an input threshold voltage set to a constant voltage for all combinations of input signals.

This keeps the circuit from operating erroneously in response to noise.

The driving performance of the driving transistors is adjusted so that a current driving performance, i.e., a current driving characteristic, of a transistor or a group of transistors constituting the driving circuit of the NAND gate circuit and arranged closer to the high potential voltage side is larger than that of a transistor or a group of transistors arranged closer to the low potential voltage side.

More specifically, in an embodiment of the present invention having two driving transistors, as shown in FIG. 7(A), the driving performance of the second transistor $T_3$ connected between the first transistor $T_2$ and a source wire of the low potential voltage side is lower than that of the first transistor $T_2$ arranged closest to the output terminal $N_1$.

Further, when the NAND gate circuit includes a third, fourth and fifth transistors, it is preferable that the farther the transistor is from the first driving transistor in the direction of the low potential voltage side, the smaller the driving performance of the driving transistor.

The plurality of the driving transistors may be classified into a plurality of groups and the transistors belonging to a group arranged closer to the low potential source than another group may have a smaller driving performance than the transistors belonging to the other group.

In designing NAND gate circuit, the current driving performance of each of the driving transistors thereof is previously adjusted so that each of the transistors or each of the groups of the transistors has a different current driving performance.

Therefore, the input threshold voltages of the NAND gate circuit can be fixed at nearly the same value or at closely approximating values for all combinations of the input signals used in the NAND gate circuit, for example, where the gate input voltage to a certain driving transistor is changed, while the gate input voltages to the rest of the driving transistors are set at a fixed voltage of 5 V or where all gate input voltages to all the gates of the driving transistors are simultaneously changed.

To improve the overall noise immunity of the NAND gate circuit, it is preferable that the input threshold voltage be set to a value the same as close to a half of the source voltage ($V_{cc}/2$)

The technical concept of varying the current driving characteristic of the driving transistors, means that while a conventional NAND gate circuit uses two driving transistors having an input threshold voltage $V_{th}$ of 0.6 V, i.e., the driving transistors $T_2$ and $T_3$, as shown in FIG. 1(a), the present invention uses a driving transistor $T_2$ having a $V_{th}$ of 0.6 V and a driving transistor $T_3$ having a $V_{th}$ of 0.8 V.

There are several methods for varying the driving performance of the driving transistors.

The first is to adjust one or both of the channel length (L) or an channel width (W) of the transistors, in another words, the ratio thereof (W/L).

The second is to change the input threshold voltage $V_{th}$ of the transistor by varying the concentration of impurities of a substrate by ion implantation or by varying the film thickness of the gate oxide film of the transistor.

This method is more advantageous than varying the $V_{th}$ from the manufacturing process point of view.

In the present invention, all of the driving transistors used as the driving circuit may be of the same type. The extent of the adjustment can be freely determined depending upon the amount of the load, the source voltage the input voltage and the number of the transistors used, and the like.

The NAND gate circuit can be used effectively as a decoder circuit required to have a large noise immunity. Especially, the use thereof for a NAND type decoder in a semiconductor memory device is remarkably effective.

In another embodiment, five or six driving transistors are used as shown in FIG. 8(A).

The driving performance of the driving transistors may be varied by the manner explained above, although it is not preferable to give each driving transistor a different $V_{th}$.

Accordingly, as mentioned above, the driving transistors may be classified into a plurality of groups and a different $V_{th}$ set out for each group.

That is, all of the transistors belonging to one group will have the same driving performance, which is different from that of the transistors belonging to other group.

More specifically, the closer to the low potential side source wire ($V_{ss}$) the group is arranged, the smaller the driving performance the transistors of the group should possess.

As stated above, the current driving characteristics of the driving transistors used in the NAND gate circuit are made different.

Driving transistors wherein current can easily flow are given a small driving performance while driving transistors wherein current cannot easily flow are given a large driving performance.

The present invention, the number of groups or number of the transistors included in one group is not restricted.

Any number of groups may be used and it is not necessary that each group have the same number of transistors.

Therefore, the range of variation of the input threshold voltage of the NAND gate circuit can be reduced and the input threshold voltages obtained under different conditions made nearly the same value.

It is possible to set the central value of the input threshold voltage to an ideal value of a half of the source voltage ($V_{cc}/2$).

Therefore, even when noise is added to an input signal voltage or when the input signal is in an intermediate transition condition, the NAND gate circuit can operate accurately without any erroneous operation.

The above explanation was made referring to one type of transistors in the NAND gate circuit as an example, but the opposite type thereof may be used.

Also, the decoder source voltage $V_{PPI}$ and $V_{cc}$ may be either an external source voltage or internal source voltage.

Further, the NAND gate circuit was explained in terms of use as a row decoder circuit as shown in FIG. 6, but can also be used as a column decoder.

More specific embodiments of the present invention will be explained below.

FIG. 7(A) shows a circuit indicating one embodiment of the NAND gate circuit according to the present invention.

In FIG. 7(A), the NAND gate circuit is provided with a source voltage $V_{cc}$, a ground voltage $V_{ss}$ i.e., 0 V, an N-channel depletion type load transistor $T_1$, and the N-channel enhancement type transistors $T_2$ and $T_3$ with different input threshold voltages.

The $V_{th}$ of the transistor $T_3$ is set at 0.8 V, while the $V_{th}$ of the transistor $T_2$ is set out at 0.6 V, i.e., the $V_{th}$ of the transistor $T_3$ is higher than that of the transistor $T_2$. Due to this, the input threshold voltage of the NAND gate circuit can be made nearly the same value for all combinations of input signals given to input terminals a and b.

Figure 7B:
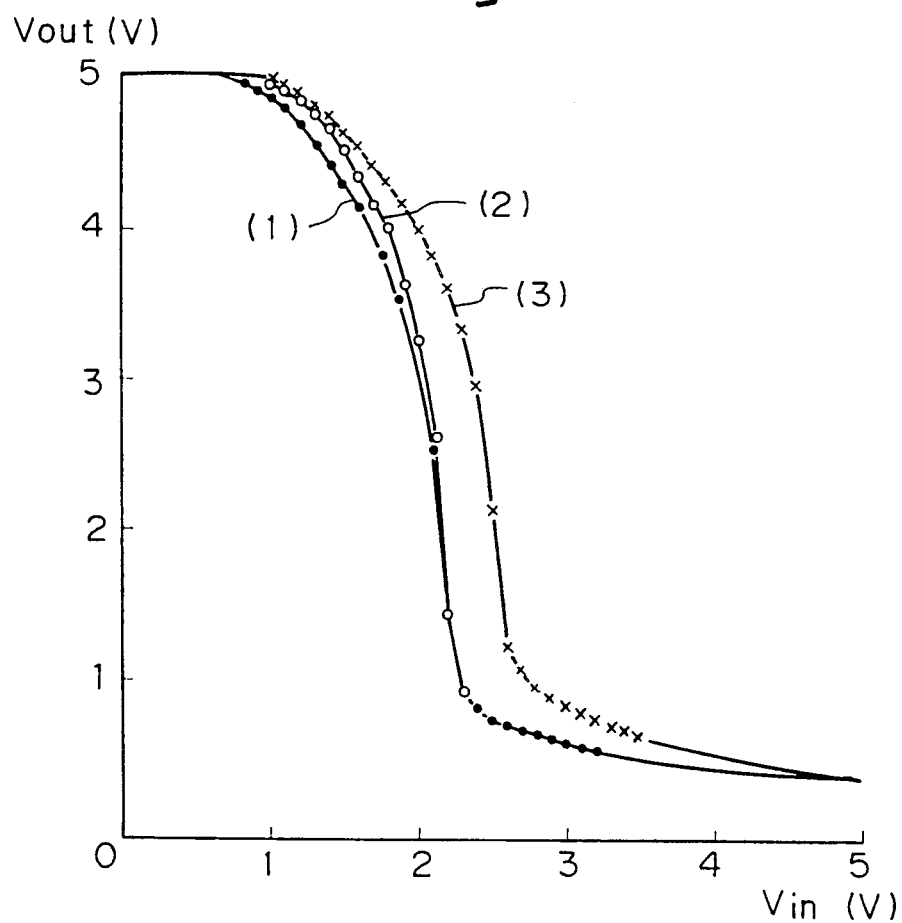
FIG. 7(B) is a graph showing the input-output curve of an input threshold voltage of the NAND gate circuit shown in FIG. 7(A)

In this embodiment, when the NAND gate circuit is operated at $V_{cc}=5$ V, for example, as shown in FIG. 7(B), the input threshold voltage of the NAND gate circuit is 2.15 V when the input voltage applied to one of the input terminals a or b is changed and the input voltage of the other input terminal is fixed.

The input threshold voltage is 2.5 V when both the input voltages to the input terminals a and b are simultaneously changed.

Accordingly, a noise margin of 2.50 V is provided when descending from $V_{cc}$ and one of 2.15 V when rising from $V_{ss}$.

Therefore, the NAND gate circuit of the present invention possesses a greater overall noise resistance than the conventional NAND gate circuit.

FIGS. 8(A) shows a NAND gate circuit having five input terminals provided with five driving transistors.

The difference in input-output characteristics over a conventional NAND gate circuit including five driving transistors the same as shown in FIG. 8(A) will be explained.

In the conventional NAND gate circuit, all of the driving transistors $T_2$ to $T_6$ have the same driving performance.

Assume, the transistors $T_2$ and $T_6$ each have a $V_{th}$ of 0.6 V, a thickness of a gate oxide film of 350 Å, a gate width of 50 μm, and a gate length of 2 μm, while the transistor $T_1$ has a $V_{th}$ of $-3.5$ V, a thickness of a gate oxide film of 350 Å, a gate width of 8 μm, and a gate length of 5 μm.

FIG. 8(B) is a graph of the input-output curve of the conventional NAND gate circuit.

The curves (1) to (6) are obtained when the NAND gate circuit is operated at a $V_{cc}$ of 5 V.

Curve (1) was obtained when all of the inputs a to e were varied.

Curve (2) was obtained when only the input a was varied, while the inputs b to e were fixed at $V_{cc}$.

Curve (3) was obtained when only the input b was varied, while the inputs a and c to e were fixed at $V_{cc}$.

Curve (4) was obtained when only the input c was varied, while the inputs a, b, d and e were fixed at $V_{cc}$.

Curve (5) was obtained when only the input d was varied, while the inputs a to d were fixed at $V_{cc}$.

Curve (6) was obtained when only the input e was varied, while the inputs a to d were fixed at $V_{cc}$.

As apparent from FIG. 8(B), the lowest input threshold voltage of the NAND gate circuit is 1.40 V, obtained when only the input e was only varied, while the highest thereof is 2.40 V, obtained when all of these inputs a to e were changed.

Figure 8C:
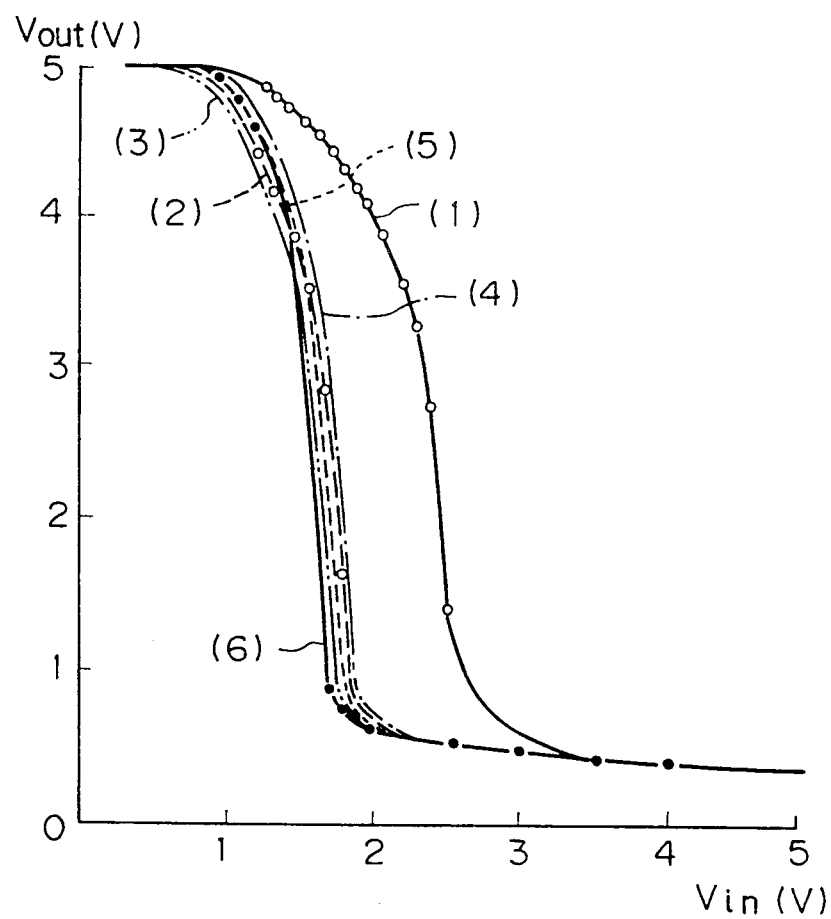
FIG. 8(C) shows the input-output curves of the NAND gate circuit of the embodiment of the present invention.

FIG. 8(C) shows the input-output curves of the NAND gate circuit of the embodiment of the present invention.

The NAND gate circuit of this embodiment has the same construction as shown in FIG. 8(A), but the five transistors $T_2$ to $T_6$ are divided into two groups, one composed of two transistors $T_2$ and $T_3$ and the other of three transistors $T_4$, $T_5$, and $T_6$.

Each transistor belonging to the former group has a $V_{th}$ of 0.6 V, while each of the latter group has a $V_{th}$ of 0.8 V.

As shown in FIG. 8(C), the lowest input threshold voltage of the NAND gate circuit is 1.65 V, obtained when only the input e was varied, while the highest input threshold voltage was 2.45 V, obtained when all of the these inputs a to e were simultaneously varied.

Thus, the noise immunity of the NAND gate circuit of the present invention can be widened compared with that of the conventional NAND gate circuit.

Note that, in FIGS. 8(B) and 8(C), only six input-output characteristic curves are indicated, which were obtained under six different input conditions as explained above, many other such curves can be drawn which can be obtained under other conditions, for example, when the input voltages a and b are varied while the rest are fixed or the input voltages a, c, and e are varied and the input voltages b and d are fixed.

As explained above, in accordance with the present invention, the overall noise immunity of the NAND gate circuit is enlarged since the input threshold voltages of the NAND gate circuit obtained for all combinations of the input signals can be set at nearly the same value.

Thus, it is difficult for the NAND gate circuit to erroneously operate by noise, so erroneous operation of the memory cell array caused by noise can also effectively be prevented, contributing to improvement of the reliability of the NAND gate circuit.

What is claimed:

1. A NAND gate circuit comprising:
   a high potential voltage source line;
   an output terminal;
   a low potential voltage source line;
   a load element connected between said high potential voltage source line and said output terminal; and
   a driving circuit, connected between said output terminal and said low potential voltage source line, including a plurality of driving transistors connected in series, said driving transistors being controlled by an input signal being applied to each gate, at least one of the driving transistors having a driving performance different from that of the other driving transistors constituting said driving circuit.

2. A NAND gate circuit according to claim 1, wherein said driving transistors are comprised of a first transistor connected closest to said output terminal, the first transistor having the highest driving performance of said driving transistors.

3. A NAND gate circuit according to claim 1, wherein said driving transistors are comprised of a first transistor and a second transistor, said first transistor, connected closest to said output terminal, having driving performance higher than said second transistor.

4. A NAND gate circuit according to claim 1, wherein all the driving transistors constituting said driving circuit, have different driving performances.

5. A NAND gate circuit according to claim 1, wherein the driving transistors, connected closer to the output terminal have a higher driving performance.

6. A NAND gate circuit comprising:
   a high potential voltage source line;
   an output terminal;
   a low potential voltage source line;
   a load element connected between said high potential voltage source line and said output terminal; and
   a driving circuit, connected between said output terminal and said low potential voltage source line, including a plurality of driving transistors connected in series, said driving transistors being controlled by an input signal being applied to each gate, at least one of the driving transistors having a driving performance different from that of the other driving transistors constituting said driving circuit, said driving transistors are classified into a plurality of groups, each of the transistors belonging to a group having the same driving performance, which is different from that of those belonging to other groups.

7. A NAND gate circuit comprising:
   a high potential voltage source line;
   an output terminal;
   a low potential voltage source line;
   a load element connected between said high potential voltage source line and said output terminal; and
   a driving circuit, connected between said output terminal and said low potential voltage source line, including a plurality of driving transistors connected in series, said driving transistors being controlled by an input signal being applied to each gate, at least one of the driving transistors having a driving performance different from that of the other driving transistors constituting said driving circuit, said driving transistors are classified into a plurality of groups, each of the transistors belonging to a group having the same driving performance, which is different from that of those belonging to other groups, the group of transistors, connected closer to said low potential voltage source line, having a lower driving performance.

8. A NAND gate circuit according to claim 1, wherein said NAND gate circuit is used for a decoder circuit of a semiconductor memory device.

9. A NAND gate circuit according to claim 1, wherein said driving performance is determined by the channel width and channel length.

10. A NAND gate circuit according to claim 1, wherein said driving performance is determined by the concentration of impurities in a channel region of said driving transistor.

11. A NAND gate circuit according to claim 1, wherein said driving performance is determined by the thickness of a gate oxide film of said driving transistor.

* * * * *

REEXAMINATION CERTIFICATE (1846th)

United States Patent [19]
Yoshida

[11] B1 5,059,825
[45] Certificate Issued Nov. 10, 1992

[54] NAND GATE CIRCUIT

[75] Inventor: Masanobu Yoshida, Yokohama, Japan

[73] Assignee: Fujitsu Limited, Kawasaki, Japan

Reexamination Request:
No. 90/002,605, Jan. 31, 1992

Reexamination Certificate for:
Patent No.: 5,059,825
Issued: Oct. 22, 1991
Appl. No.: 424,038
Filed: Oct. 19, 1989

[30] Foreign Application Priority Data

Oct. 27, 1988 [JP] Japan ................ 63-269408

[51] Int. Cl.[5] .......... H03K 19/017; H03K 19/094; H03K 19/20; H03K 17/687
[52] U.S. Cl. ................ 307/448; 307/449; 307/443; 307/452; 307/453
[58] Field of Search ............ 307/448, 449, 443, 451

[56] References Cited

U.S. PATENT DOCUMENTS

| | | | |
|---|---|---|---|
| 4,430,583 | 2/1984 | Shoji | 307/448 |
| 4,620,116 | 10/1986 | Ozawa | 307/449 |
| 4,649,296 | 3/1987 | Shoji | 307/443 X |
| 4,684,829 | 8/1987 | Uratani | 307/451 X |
| 4,730,133 | 3/1988 | Yoshida | 307/452 X |
| 4,780,626 | 10/1988 | Guerin | 307/453 X |
| 4,797,580 | 1/1989 | Sunter | 307/443 X |
| 4,827,160 | 5/1989 | Okano | 307/449 X |
| 4,851,716 | 7/1989 | Needles | 307/443 X |

OTHER PUBLICATIONS

Mead & Conway, *Introduction to VLSI Systems*, Addison-Wesley Pub. Co., Reading, Mass., Oct. 1980, pp. 1–5.

*Primary Examiner*—D. R. Hudspeth

[57] ABSTRACT

A NAND gate circuit which can be used for a decoder circuit, includes a high potential voltage soucrce ($V_{cc}$), an output terminal ($V_{OUT}$), and a load element ($T_1$) connected between the high potential electric voltage source ($V_{cc}$) and the output terminal ($V_{OUT}$). A driving circuit is serially connected with the output terminal ($V_{OUT}$), and a low potential voltage source ($V_{ss}$), and has a plurality of driving transistors ($T_2$, $T_3$) which are serially arranged. An input signal is applied to each gate. At least one transistor, constituting the driving circuit, has a driving performance different from the other transistors of the driving circuit. An ideal NAND gate circuit can be provided in which erroneous operation due to noise can be effectively prevented by setting the input threshold voltage to a constant voltage no matter what the combination of the input signals.

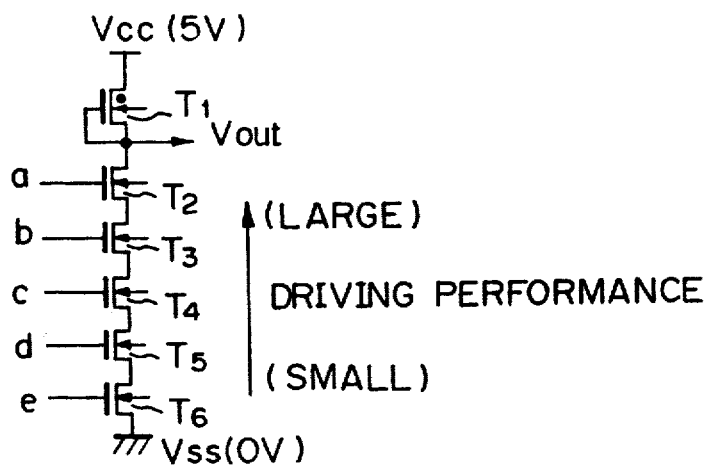

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT

The patentability of claim 7 is confirmed.

Claims 5 and 6 are cancelled.

Claim 1 is determined to be patentable as amended.

Claims 2–4 and 8–11, dependent on an amended claim, are determined to be patentable.

1. A NAND gate circuit comprising:
a high potential voltage source line;
an output terminal;
a low potential voltage source line;
a load element connected between said high potential voltage source line and said output terminal; and
a driving circuit connected between said output terminal and said low potential voltage source line, including a plurality of driving transistors connected in series, said driving transistors being controlled by an input signal being applied to each gate, at least one of the driving transistors having a driving performance different from that of the other driving transistors constituting said driving circuit, *wherein the driving transistors, connected closer to the output terminal, have a higher driving performance.*

* * * * *